United States Patent
Marion et al.

(10) Patent No.: US 6,170,155 B1
(45) Date of Patent: *Jan. 9, 2001

(54) SYSTEM OF COMPONENTS TO BE HYBRIDIZED AND HYBRIDIZATION PROCESS ALLOWING FOR THERMAL EXPANSIONS

(75) Inventors: François Marion, Saint Gareve; Chantal Chantre, Seyssins, both of (FR)

(73) Assignee: Commissariat a l'Energie Atomique, Paris (FR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/856,721

(22) Filed: May 15, 1997

(30) Foreign Application Priority Data

May 20, 1996 (FR) .................................................. 96 06221

(51) Int. Cl.[7] ...................................................... H05K 3/34
(52) U.S. Cl. ................................ 29/840; 29/844; 29/842; 228/179.1
(58) Field of Search ............................ 29/840, 830, 832, 29/829, 739, 741, 841, 842, 25.01; 228/56.3, 180.22, 193, 197, 195, 245

(56) References Cited

U.S. PATENT DOCUMENTS

| 5,217,597 | * | 6/1993 | Moore et al. | 29/840 |
| 5,294,564 | * | 3/1994 | Karapiperis | 437/81 |
| 5,448,114 | | 9/1995 | Kondoh et al. . | |
| 5,478,778 | * | 12/1995 | Tanisawa | 29/840 |
| 5,551,627 | * | 9/1996 | Leich et al. | 29/840 |

FOREIGN PATENT DOCUMENTS

| 4323799 | 1/1994 | (DE) . |
| 0332402 | 9/1989 | (EP) . |
| 8701509 | 3/1987 | (WO) . |
| 9428581 | 12/1994 | (WO) . |

* cited by examiner

Primary Examiner—Lee Young
Assistant Examiner—Sean Smith
(74) Attorney, Agent, or Firm—Pearne & Gordon LLP

(57) ABSTRACT

This invention relates to a system of components to be hybridized including at least one first component (110) with first pads (114a) and with a first coefficient of expansion, and at least one second component (112) with second pads (114b) and with a second coefficient of expansion. According to the invention, at a hybridization temperature Th the pads are approximately superposable, and at an ambient temperature Ta the pads are mutually offset by a distance compensating for the differential expansion of the first and second components.

18 Claims, 2 Drawing Sheets

SYSTEM OF COMPONENTS TO BE HYBRIDIZED AND HYBRIDIZATION PROCESS ALLOWING FOR THERMAL EXPANSIONS

BACKGROUND OF THE INVENTION

1. Technical Field

This invention relates to a system of components to be hybridized adapted to a hybridization technique by melting of solder balls of the type referred to as "flip-chip". The invention also relates to a process for preparing these components and a hybridization process using these components.

The invention will be applied particularly in the electronic and optical fields for interconnection of components made of different materials.

For example, the invention is particularly useful for interconnection of silicon components with AsGa or InSb components.

For the purposes of this invention, a component may be an electronic component such as an electronic chip, an electronic or opto-electronic circuit support, or a mechanical component such as a cover or a physical magnitudes sensor.

In particular, the invention may be used for the manufacture of infrared detectors, the manufacture of lasers with a vertical cavity, or to transfer a matrix of AsGa read photodiodes onto an Si read circuit.

2. State of Prior Art

A distinction is made between two main techniques for hybridization of components by solder balls.

The first technique is called the "hybridization by melting technique" (or "flip-chip"), and uses balls of a meltable material, for example such as a tin and lead alloy (SnPb) or a tin and indium alloy (SnIn). This technique is shown in the drawing on FIGS. 1 and 2 in the appendix.

On these figures, references 10 and 12 refer to first and second components to be interconnected, respectively. The first component 10 comprises the first ball reception pads 14a, made of a material wettable by the solder balls material. Pads 14a are surrounded by an area 16a of material not wettable by the material in the balls.

Similarly, the second component 12 has second pads 14b also made of a material wettable by the balls material and surrounded by an area 16b of unwettable material.

The first and second pads 14a, 14b are associated to form pairs of pads, in locations complementary to the first and second components respectively. Thus the first and second pads in each pair of pads are located approximately opposite each other when the components to be hybridized, 10, 12 are placed in contact with each other as shown on FIG. 1.

It is considered that FIG. 1 shows the closed structure consisting of the two components at ambient temperature denoted Ta. Let L be the distance that separates the two pads on which the balls fit on each of the component.

Pads 14a of one of the components, in the event component 10, are equipped with balls 18 made of a meltable material. These balls 18 are designed to create a mechanical and/or electrical link between the pads in each pair of pads.

In order to do the hybridization, component 12 is moved onto component 10 in order to bring the pads 14b into contact with the corresponding balls 18. The entire structure is then heated up to or greater than the melting temperature of the balls so that balls 18 are soldered onto pads 14b.

All balls are thus soldered simultaneously onto their corresponding pads 14b on component 12. The structure shown on FIG. 2 is obtained after cooling. On this figure, each pad 14a of component 10 is mechanically and electrically connected to a corresponding pad 14b on component 12, by a solder ball 18.

The precision of the mutual positioning of components when component 10 is transferred to component 12 is not very critical. When the ball material melts, components 10 and 12 automatically align with each other under the effect of the surface tension of the material making up the molten balls.

In the hybridization procedure described above, all solders between the balls and reception pads are made at the same time. The hybridization by fusion process is particularly suitable for hybridization of a number of components, such as chips, on a reception component forming substrate. A high hybridization efficiency can be obtained for these structures.

FIGS. 1 and 2 illustrate the use of the hybridization by melting process for small components, and for components which have very similar coefficients of expansion.

When components to be hybridized have different coefficients of expansion, and particularly when there is a non-negligible distance between the different pads, the pads on the two components are no longer aligned when the structure temperature is increased to or above the temperature at which the ball material melts.

This situation is illustrated on FIG. 3 which shows components at the hybridization temperature Th. It is considered that the material in component 12 has a coefficient of expansion $\alpha_2$ exceeding the coefficient of expansion $\alpha_1$ of the component material 10. When the structure temperature is increased to the hybridization temperature Th, the pads 14a on component 10, and consequently balls 18, are separated by a distance L' such that:

$$L'=L(1+\alpha_1 \cdot \Delta T)$$

where L is the distance between the same pads 14a at ambient temperature Ta (FIG. 1), and $\Delta T$ is defined by $\Delta T=Th-Ta$.

In the same way, the pads 14b on component 12 are separated by a distance L' at the hybridization temperature Th such that:

$$L''=L(1+\alpha_2 \cdot \Delta T)$$

In the special case shown on FIG. 3 in which each component only has two ball reception pads, the misalignment $\Delta L$ between each pad 14b and each corresponding ball 18 is then such that:

$$\Delta L = L/2 \cdot \Delta\alpha \cdot \Delta T,$$

where $\Delta\alpha = \alpha_2 - \alpha_1$.

In some cases the misalignment between ball reception pads on substrates to be hybridized can be sufficient to compromise the hybridization operation.

For example, when substrate 10 is made of silicon ($\alpha_1$ (Si)=$2.10^{-6}$), and substrate 12 is made of gallium arsenate ($\alpha_2$ (AsGa)=$8.10^{-6}$), and when the distance between the balls 18 at an ambient temperature of 20° C. is 2 cm, and when the hybridization temperature of the 60/40 tin-lead alloy balls 18 is of the order of 220° C., the lateral offset between each pad 14b and each corresponding ball 18 is $\Delta L$=12 µm.

For example, this order of magnitude is reached for components in the form of modules with 1000 aligned connection pads at a pitch of 20 µm.

In this case, if the diameter of the wettable surface of connection pads is for example 12 μm, only balls for which offset ΔL is less than or equal to 6 μm can be connected using the hybridization by melting process. Only these balls will be in contact with the reception pads on the second component.

In order to overcome these difficulties, there is a second technique for hybridization by solder balls. This second technique is referred to as the hybridization by pressure technique.

This technique starts with a structure similar to the structure shown on FIG. 1. Component 12 is transferred to component 10 by making the pads 14b coincide very precisely with the balls 18. Then, balls 18 are pressed firmly into contact with pads 14b in order to form a connection by thermo-compression, by exerting appropriate forces on components 10 and 12.

This operation may take place at a temperature below the ball material melting temperature, and in particular at a temperature close to ambient temperature.

Thus, by limiting temperature excursions ΔT, the problem of a misalignment between pads 14b and balls 18, or pads 14a, does not arise, even when the components are made of materials with different coefficients of expansion.

However, the hybridization by pressure technique does have a number of disadvantages compared with the hybridization by melting technique.

For example, for hybridization by pressure, components to be hybridized must be aligned with very high precision. The self-alignment phenomenon described above does not occur at temperatures below the melting point of the ball material.

Furthermore, unlike hybridization by melting, hybridization by pressure is unsuitable for the simultaneous connection of a large number of components during the same operation.

Furthermore, much lower hybridization rates are possible with hybridization by pressure.

Finally, one purpose of this invention is to propose a system of components to be hybridized and a process for preparation and hybridization of components, which does not have the disadvantages or the limitations mentioned above.

In particular, one purpose of the invention is to propose a system of components to be hybridized and a hybridization process which does not have any misalignment problems at the hybridization temperature.

Another purpose is to propose a hybridization process enabling the simultaneous interconnection of a large number of components.

Another purpose of the invention is to propose a system of components to be hybridized and a hybridization process capable of automatically aligning components.

BRIEF SUMMARY OF THE INVENTION

In order to achieve these purposes, one of the specific objectives of the invention is a system of components to be hybridized comprising at least a first component with first hybridization ball reception pads and with a first coefficient of thermal expansion, and at least one second component with second hybridization ball reception pads and with a second coefficient of thermal expansion, the first and second pads being related to each other in pairs to form pairs of pads, characterized in that at a hybridization temperature Th, the first and second pads in each pair of pads are approximately superposable and at an ambient temperature Ta, the pads are in a position such that when the second component is placed on the first component, the first and second pads in each pair of pads are mutually offset along a direction connecting the pads in the pair of pads to a center of gravity of the first and second pads, by a distance compensating for the differential thermal expansion of the first and second components between ambient temperature and the hybridization temperature.

The mutual offset of the pads is understood as being an offset parallel to the hybridization surfaces of the components facing each other.

Furthermore, it is assumed that the first and second components are transferred one above the other when a center of gravity of the first and a center of gravity of the second pads are superposed on the first and second components, respectively.

Since the first and second pads are associated in pairs of pads superposable at the hybridization temperature, and the center of gravity of the pads is defined as being invariable when expansion takes places, a single point projected onto each of the components respectively is defined by the center of gravity of the first pads and the center of gravity of the second pads when the second component is transferred onto the first component. This point is designated by the center of gravity of the first and second pads.

Due to the characteristics of the invention, there is a misalignment between the ball reception pads at ambient temperature, but this misalignment disappears at the hybridization temperature Th.

The hybridization temperature is a temperature equal to or greater than the melting temperature of the solder balls, at which the hybridization is done.

The mutual offset distance between the pads forming the pairs of pads is preferably calculated such that this offset is approximately zero when the temperature Th is reached.

Thus according to one aspect of the invention, the compensation distance between the first and second pads in each pair of pads can be chosen to be proportional to:

- a distance separating the first and second pads from the center of gravity of the first and second pads,
- a difference in temperature between the ambient temperature Ta and the hybridization temperature Th and,
- a difference between the first and second coefficients of expansion.

If the second coefficient of expansion of the material in the second component exceeds the first coefficient of expansion of the material in the first component, the second pads will be in a position offset from their position at ambient temperature, compared with the corresponding first pads, in the direction that connects them to the center of gravity of the second pads on the second component.

When the component temperature is increased up to the value Th, the first and the second pads move away from the center of gravity of the first and second pads respectively, under the effect of expansion.

However, if the second coefficient of expansion exceeds the first coefficient of expansion, the displacement of the second pads will be higher and will compensate for the initially provided offset.

More specifically, according to a specific embodiment of the system of components according to the invention, the first and second pads in each pair of pads (I) are formed at a location such that at ambient temperature they are at a distance from the center of gravity of the pads equal to $d_1(i)$ and $d_2(i)$ such that $d_1(i)(1+\alpha_1\Delta T)=d_2(i)(1+\alpha_2\Delta T)$ where $\alpha_1$ and $\alpha_2$ are the first and second coefficients of expansion respectively, and $\Delta T$ is the difference between the hybridization temperature and the ambient temperature.

At least one of the pads in each pair of pads is equipped with a ball made of a meltable material, for example a ball made of an SnPb alloy.

According to one particular embodiment of the first and second components, the first pads are equipped with balls of a meltable material, whereas the second pads are not.

Another purpose of the invention is a process for preparation of at least one first and at least one second component for their hybridization by solder balls, the first component comprising first ball reception pads and with a first coefficient of expansion, the second component comprising second ball reception pads and with a second coefficient of expansion, the first and second pads being associated in pairs respectively to form pairs of pads, characterized in that the first and second pads are formed on the first and second components at locations such that:

- at a hybridization temperature Th, the first and second pads in each pair of pads are approximately superposable,
- at an ambient temperature Ta, the pads in each pair of pads are mutually offset by a compensation distance equal to the differential expansion between the first and second components between the ambient temperature Ta and hybridization temperature Th,
- then the first pads and/or the second pads are equipped with balls made of a meltable material.

The invention also concerns a hybridization process in which:

- the first and second components are equipped with ball reception pads and solder balls, as described above,
- the first and second components are placed in contact with each other,
- all the first and second components and balls are increased to the hybridization temperature to interconnect the first and second pads of each pair of pads by soldering the balls on the pads, and,
- the structure thus obtained is cooled.

Other characteristics and advantages of the invention will become clear with reference to the figures in the drawings in the appendix, which are given for illustrative and non-restrictive purposes.

DETAILED DESCRIPTION OF EMBODIMENTS OF THE INVENTION

Figure 1:
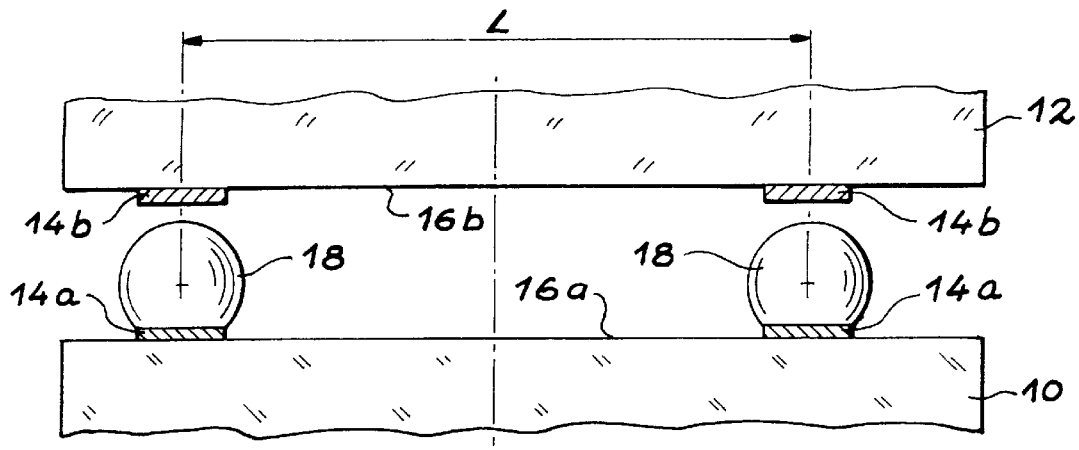
FIG. 1, already described, is a diagrammatic section through a system of components to be hybridized, at ambient temperature, illustrating known hybridization techniques.
Figure 2:
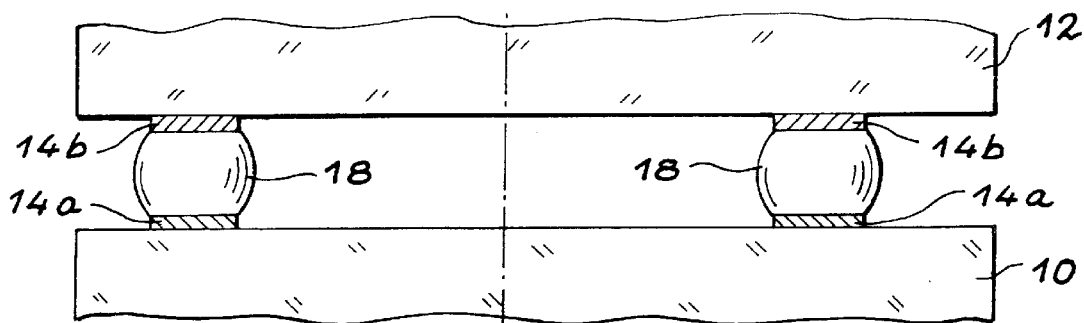
FIG. 2, already described, is a diagrammatic section of the system of components in FIG. 1 after hybridization.
Figure 3:
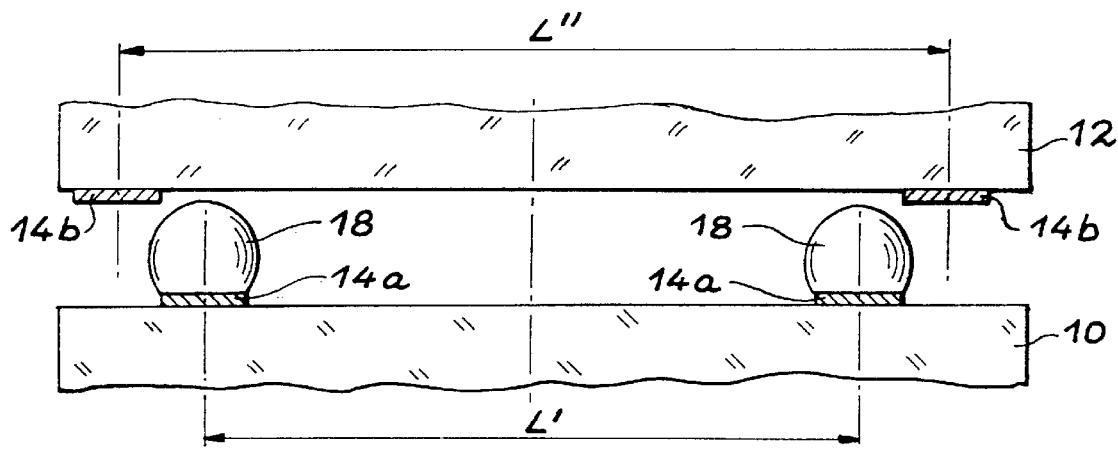
FIG. 3, already described, is a diagrammatic section of the system of components to be hybridized in FIG. 1, at a temperature exceeding the ambient temperature, in which components are made of materials with different coefficients of expansion.
Figure 4:
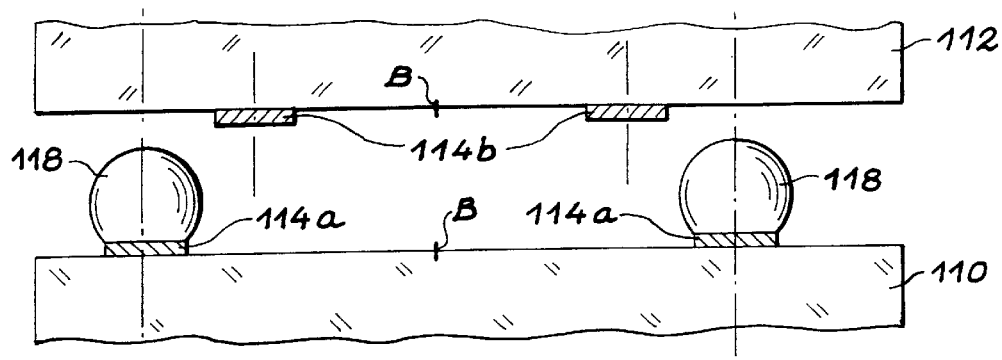
FIG. 4 is a diagrammatic section before hybridization of a system of components to be hybridized conform with the invention and at ambient temperature.
Figure 5:
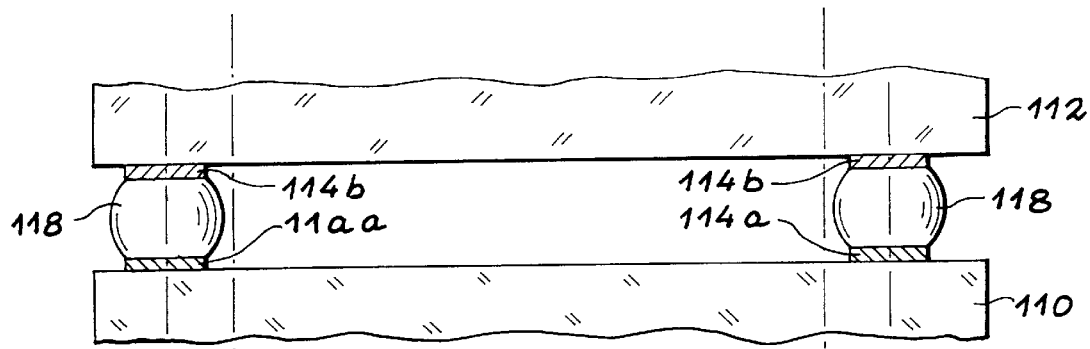
FIG. 5 is a schematic cross-section of the system of components in FIG. 4 at a component hybridization temperature.
Figure 6:
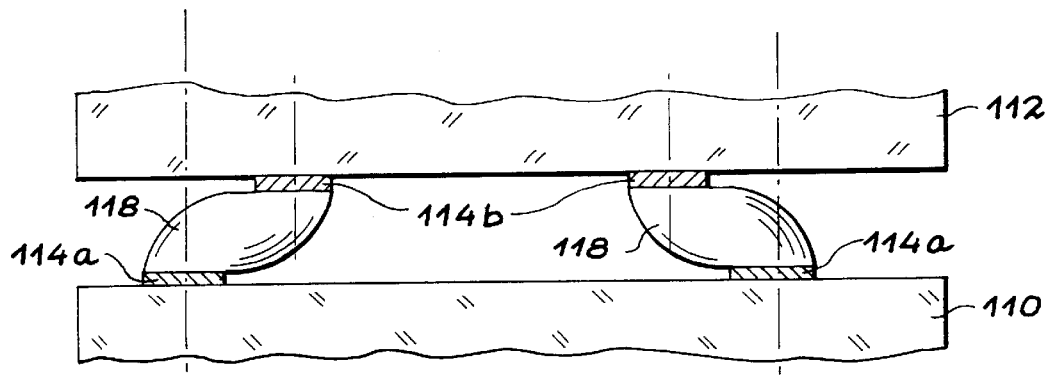
FIG. 6 is a diagrammatic section of the system of components in FIG. 4 at ambient temperature, after hybridization.

Elements in FIGS. 4 to 6 identical or similar to elements in FIGS. 1 to 3 are assigned the same numbers plus 100.

FIG. 4 shows a system of components in accordance with the invention. This system comprises a first component 110 equipped with ball reception pads 114a and a second component 112 equipped with ball reception pads 114b. For example, component 110 may correspond to a substrate and component 112 may correspond to an electronic chip to be transferred onto the substrate. For simplification reasons, it is considered that components must be electrically and/or mechanically connected together by only two balls made of a meltable material. Pads 114a and 114b are made of a material wettable by the balls, for example made of copper, and are surrounded by a material that is not wettable by the balls.

Pads 114a are equipped with weld balls 118, for example, made of an SnPb alloy (40/60).

Balls may be formed on the connection pads using a known process, for example by having the ball material grow above the pads by electrolysis, and then by shaping this material by heating.

Components 110 and 112 on FIG. 4 are represented in their state at ambient temperature, for example 20° C., immediately before the hybridization operation.

L is the distance separating the balls 118 on component 110. Therefore, each ball 118 is at a distance of L/2 from the center of gravity of the balls, assuming that on this component in the example there are only the two balls visible in the figure.

The center of gravity of the balls or pads 114a in a plane parallel to the surface of component 110 is considered as being superimposed on the center of gravity of pads 114b on component 112, within the component positioning error. On FIG. 4, the center of gravity is represented at the surface of the components with the letter B.

Pads 114b are each offset towards the center of gravity B on component 112, by a distance corresponding to the differential expansion of the two components.

In the case in the example shown in FIG. 4, each pad 114b is offset towards the center of gravity by a distance d such that: $d=(L/2).\Delta\alpha.\Delta\gamma$, where $\Delta\alpha$ is the difference between the coefficient of expansion $\alpha_2$ of the material in component 112 and the coefficient of expansion $\alpha_1$ of the material in component 110.

FIG. 5 shows components 110 and 112 increased to the hybridization temperature Th.

As it increases from the ambient temperature to the hybridization temperature, component 112 expands more than component 110 and its pads 114b are then facing pads 114a.

Component 112 is lowered, and the material in the melting balls is soldered onto pads 114b. Centering of components 110 and 112 on each other takes place at the hybridization temperature under the effect of surface tension forces in the ball material.

FIG. 6 shows the structure obtained after cooling. Components 110 and 112 contract during cooling and pads 114a and 114b return to approximately their initial position as shown on FIG. 4.

Note also on FIG. 5 that the material in the balls has been deformed such that each ball still connects the pads 114a and 114b corresponding to it.

Finally, it appears that carrying out a hybridization according to the invention does not require any additional step compared with known hybridization by melting.

However, during the design of component assembly surfaces, the position of ball reception pads is calculated such that there is an offset at ambient temperature, but this offset is compensated by a set of differential expansions of the components.

In particular applications, only part of an element to be hybridized can be concerned by the component preparation process according to the invention. This part is then considered to be a component to be hybridized in the meaning of the invention.

What is claimed is:

1. System of components to be hybridized comprising at least one first component (110) with first hybridization ball reception pads (114a) and with a first coefficient of thermal expansion ($\alpha_1$) and at least one second component (112) with second hybridization ball reception pads (114b) and with a second coefficient of thermal expansion ($\alpha_2$) different from said first coefficient of thermal expansion ($\alpha_1$), the first and second pads being associated in pairs to form pairs of pads, wherein at a hybridization temperature (Th) the first and second pads (114a, 114b) in each pair of pads are approximately superposable, and at ambient temperature (Ta), the pads (114a, 114b) occupy a position such that when the second component (112) is placed above the first component (110), the first and second pads (114a, 11b) in each pair of pads are mutually offset along a direction connecting the pads in the pair of pads, by a distance compensating a differential expansion of the first and second components (110, 112) between the ambient temperature (Ta) and the hybridization temperature (Th), said differential expansion being due to the difference between said first and second coefficients of thermal expansion.

2. System according to claim 1, wherein the compensation distance between the first and second pads (114a, 114b) in each pair of pads is proportional to:

a distance separating the first and second pads (114a, 114b) from a center of gravity (B) of the first and second pads, respectively;

a temperature difference between the ambient temperature (Ta) and the hybridization temperature (Th); and a difference between the first and second coefficients of expansion ($\alpha_1$, $\alpha_2$).

3. System according to claim 1, wherein the second coefficient of expansion ($\alpha_2$) is greater than the first coefficient of expansion ($\alpha_1$) and at ambient temperature the second pads (114b) are placed in a position which is offset from the corresponding first pads, along a direction bringing them towards a center of gravity (B) of the pads on the second component.

4. System according to claim 1, wherein the first and second pads (114a, 114b) of each pair of pads (i) are formed at a location such that at ambient temperature they are at a distance from the center of gravity of pads (b) by a distance $d_1(i)$ and $d_2(i)$ such that $d_1(i) (1+\alpha_1 \blacktriangle T) = d_2(i) (1+\alpha_2 \blacktriangle T)$ where $\alpha_1$ and $\alpha_2$ are the first and second coefficients of expansion respectively, and $\blacktriangle T$ is a difference between the hybridization temperature and the ambient temperature.

5. System according to claim 1, wherein the first pads (114a) are equipped with solder balls.

6. Process for preparing at least one first and at least one second component (110, 112) for their hybridization by solder balls (110), the first component (110) comprising first ball reception pads (114a) and with a first coefficient of expansion ($\alpha_1$), the second component (112) comprising second ball reception pads (114b) and with a second coefficient of expansion ($\alpha_2$) different from said first coefficient of expansion ($\alpha_1$), the first and second pads being associated in pairs respectively to form pairs of pads, comprising the steps of:

forming the first and second pads (114a, 11b) on the first and second components at locations such that at hybridization temperature (Th) the first and second pads (114a, 114b) of each pair of pads are approximately superposable, and such that at ambient temperature (Ta), the first and second pads in each pair of pads are mutually offset by a distance to compensate for differential expansion of the first and second components between ambient temperature (Ta) and hybridization temperature (Th), said differential expansion being due to the difference between said first and second coefficients of thermal expansion; and equipping at least one of the first and second pads with balls made of a meltable material (118).

7. Hybridization process using solder balls, of at least one first component (110) with at least one second component (112), comprising the steps of:

equipping the first and second components with ball reception pads (114a, 114b) and solder balls (118), in accordance with the preparation process according to claim 6;

placing the first and second components on each other (110, 112);

increasing the temperature of the first and second components (110, 112) and balls (118) to the hybridization temperature (Th) to interconnect the first and second pads (114a, 114b) in each pair of pads, by soldering the balls (118) on these pads; and cooling the structure thus obtained.

8. System according to claim 1, wherein one of said first and second components comprises silicon and the other of said first and second components comprises a material selected from the group of AsGa and InSb.

9. Process according to claim 6, further comprising the step of forming one of the first and second components of silicon and the other of said first and second components of a material selected from the group of AsGa and InSb.

10. System of components to be hybridized comprising at least one component (110) with first hybridization ball reception pads (114a) and with a first coefficient of thermal expansion ($\alpha_1$) and at least one second component (112) with second hybridization ball reception pads (114b) and with a second coefficient of thermal expansion ($\alpha_2$) substantially different from said first coefficient of thermal expansion ($\alpha_1$), the first and second pads being associated in pairs to form pairs of pads, wherein at a hybridization temperature (Th) the first and second pads (114a, 114b) in each pair of pads are approximately superposable, and at ambient temperature (Ta), the pads (114a, 114b) occupy a position such that when the second component (112) is placed above the first component (110), the first and second pads (114a, 114b) in each pair of pads are mutually offset along a direction connecting the pads in the pair of pads, by a distance compensating a differential expansion of the first and second components (110, 112) between the ambient temperature (Ta) and the hybridization temperature (Th), said differential expansion being due to the difference between said first and second coefficients of thermal expansion.

11. System according to claim 10, wherein the compensation distance between the first and second pads (114a, 114b) in each pair of pads is proportional to:

a distance separating the first and second pads (114a, 114b) from a center of gravity (B) of the first and second pads, respectively;

a temperature difference between the ambient temperature (Ta) and the hybridization temperature (Th); and a difference between the first and second coefficients of expansion ($\alpha_1$, $\alpha_2$).

12. System according to claim 10, wherein the second coefficient of expansion ($\alpha_2$) is greater than the first coefficient of expansion ($\alpha_1$), and at ambient temperature the second pads (114b) are placed in a position which is offset from the corresponding first pads, along a direction bringing them towards a center of gravity (B) of the pads on the second component.

13. System according to claim 10, wherein the first and second pads (114a, 114b) of each pair of pads (i) are formed at a location such that at ambient temperature they are at a distance from the center of gravity of pads (b) by a distance $d_1(i)$ and $d_2(i)$ such that $d_1(i) (1+\alpha_1 \blacktriangle T)=d_2(i) (1+\alpha_2 \blacktriangle T)$ where $\alpha_1$ and $\alpha_2$ are the first and second coefficients of expansion respectively, and $\blacktriangle T$ is a difference between the hybridization temperature and the ambient temperature.

14. System according to claim 10, wherein the first pads (114a) are equipped with solder balls.

15. Process for preparing at least one first and at least one second component (110, 112) for their hybridization by solder balls (110), the first component (110) comprising first ball reception pads (114a) and with a first coefficient of expansion ($\alpha_1$), the second component (112) comprising second ball reception pads (114b) and with a second coefficient of expansion ($\alpha_2$) substantially different from said first coefficient of expansion ($\alpha_1$), the first and second pads being associated in pairs respectively to form pairs of pads, comprising the steps of:

forming the first and second pads (114a, 11b) on the first and second components at locations such that at hybridization temperature (Th), the first and second pads (114a, 114b) of each pair of pads are approximately superposable, and such that at ambient temperature (Ta), the first and second pads in each pair of pads are mutually offset by a distance to compensate for differential expansion of the first and second components between ambient temperature (Ta) and hybridization temperature (Th), said differential expansion being due to the difference between said first and second coefficients of thermal expansion; and equipping at least one of the first and second pads with balls made of a meltable material (118).

16. Hybridization process using solder balls, of at least one first component (110) with at least one second component (112), comprising the steps of:

equipping the first and second components with ball reception pads (114a, 114b) and solder balls (118), in accordance with the preparation process according to claim 15;

placing the first and second components on each other (110, 112);

increasing the temperature of the first and second components (110, 112) and balls (118) to the hybridization temperature (Th) to interconnect the first and second pads (114a, 114b) in each pair of pads, by soldering the balls (118) on these pads; and cooling the structure thus obtained.

17. System according to claim 10, wherein one of said first and second components comprises silicon and the other of said first and second components comprises a material selected from the group of AsGa and InSb.

18. Process according to claim 15, further comprising the step of forming one of the first and second components of silicon and the other of said first and second components of a material selected from the group of AsGa and InSb.

* * * * *